(12) United States Patent  
Murphy et al.

(10) Patent No.: US 9,037,106 B2  
(45) Date of Patent: May 19, 2015

(54) BASEBAND HARMONIC REJECTION CIRCUIT

(71) Applicant: Broadcom Corporation, Irvine, CA (US)

(72) Inventors: David Murphy, Costa Mesa, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 190 days.

(21) Appl. No.: 13/734,863

(22) Filed: Jan. 4, 2013

(65) Prior Publication Data

US 2014/0155013 A1    Jun. 5, 2014

Related U.S. Application Data

(60) Provisional application No. 61/732,248, filed on Nov. 30, 2012.

(51) Int. Cl.

| | |
|---|---|
| H04B 1/10 | (2006.01) |
| H03F 1/02 | (2006.01) |
| H03F 3/195 | (2006.01) |
| H03F 3/21 | (2006.01) |
| H03F 3/45 | (2006.01) |
| H03F 3/72 | (2006.01) |

(52) U.S. Cl.
CPC .............. *H04B 1/109* (2013.01); *H03F 1/0277* (2013.01); *H03F 3/195* (2013.01); *H03F 3/211* (2013.01); *H03F 3/45475* (2013.01); *H03F 3/72* (2013.01); *H03F 2200/294* (2013.01); *H03F 2203/45512* (2013.01); *H03F 2203/45526* (2013.01); *H03F 2203/45528* (2013.01); *H03F 2203/7215* (2013.01); *H03F 2203/7236* (2013.01)

(58) Field of Classification Search
CPC .............. H03F 2203/7233; H03F 2203/45288; H04B 1/109; H04B 1/10
USPC .................... 455/256, 209; 330/282
See application file for complete search history.

(56) References Cited

U.S. PATENT DOCUMENTS

2013/0178183 A1*   7/2013   Rafi ............................ 455/326

* cited by examiner

*Primary Examiner* — Christian Hannon (74) *Attorney, Agent, or Firm* — McDermott Will & Emery LLP (57) ABSTRACT

A circuit for baseband harmonic rejection includes multiple transconductance cells coupled to one another at outputs of the transconductance cells and configured to receive down-converted signals that vary from one another to produce a weighted current signal proportional to a voltage corresponding to a respective down-converted signal. The circuit also includes a feedback impedance coupled between an input of one of the transconductance cells and the outputs of the transconductance cells. Each of the transconductance cells has an effective transconductance of a first magnitude for frequency components of the down-converted signal arising from a first harmonic and an effective transconductance of a second magnitude less than the first magnitude for frequency components of the down-converted signal arising from harmonics at integer multiples of the first harmonic.

20 Claims, 8 Drawing Sheets

BASEBAND HARMONIC REJECTION CIRCUIT

CROSS-REFERENCE TO RELATED APPLICATIONS

This application claims the benefit of U.S. Provisional Application No. 61/732,248, entitled "BASEBAND HARMONIC REJECTION CIRCUIT," filed Nov. 30, 2012, which is hereby incorporated by reference in its entirety for all purposes.

BACKGROUND

Wideband receivers may be configured to have an antenna connected directly to down-conversion mixers (e.g., a mixer-first receiver). The receiver can employ passive mixers, in which the passive mixers immediately down-convert the input current to baseband. A transimpedance amplifier (TIA) then converts current in the receive band to voltage. In this regard, a received signal may include an unwanted blocker signal at frequency $f_b$, and a wanted signal at frequency $f_w$, which may be $\Delta f_b$ greater than $f_b$, e.g., $f_w = f_b + \Delta f_b$.

Passive-mixer based receivers can be configured to provide sharp filtering to most out-of-band blockers before baseband amplification. However, the output of the TIA may have a signal located at harmonics of the wanted signal that experiences some amplification. Although the bandwidth around these harmonics can be very small, blocker signals located at these precise harmonic frequencies potentially cause the amplified signal to clip. For example, a receiver gain of 20× could potentially amplify a 1V blocker signal to 20V. This unnecessary amplification of such blocker signals has potential to saturate the receiver, thus resulting in degradation of performance.

SUMMARY

A circuit and/or method is provided for baseband amplification with harmonic rejection, substantially as illustrated by and/or described in connection with at least one of the figures, as set forth more completely in the claims.

BRIEF DESCRIPTION OF THE DRAWINGS

Certain features of the subject disclosure are set forth in the appended claims. However, for purpose of explanation, several implementations of the subject disclosure are set forth in the following figures.

DETAILED DESCRIPTION

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

The subject technology provides for a baseband technique to prevent amplification of down-converted harmonic blockers by using multiple phases of a passive mixer output. In addition, the baseband technique improves the harmonic rejection properties of mixer-first receiver topologies. According to some implementations, the subject technology relates to a circuit for baseband harmonic rejection that includes multiple transconductance cells coupled to one another at outputs of the transconductance cells and configured to receive down-converted signals that vary from one another to produce a weighted current signal proportional to a voltage corresponding to a respective down-converted signal. The circuit may include a feedback impedance coupled between an input of one of the transconductance cells and the outputs of the transconductance cells. Transconductance cells receiving frequency components of the down-converted signal arising from a first harmonic can be configured with an effective transconductance of a first magnitude, and transconductance cells receiving frequency components of the down-converted signal arising from harmonics at integer multiples of the first harmonic can be configured with an effective transconductance of a second magnitude that is less than the first magnitude.

Figure 1:
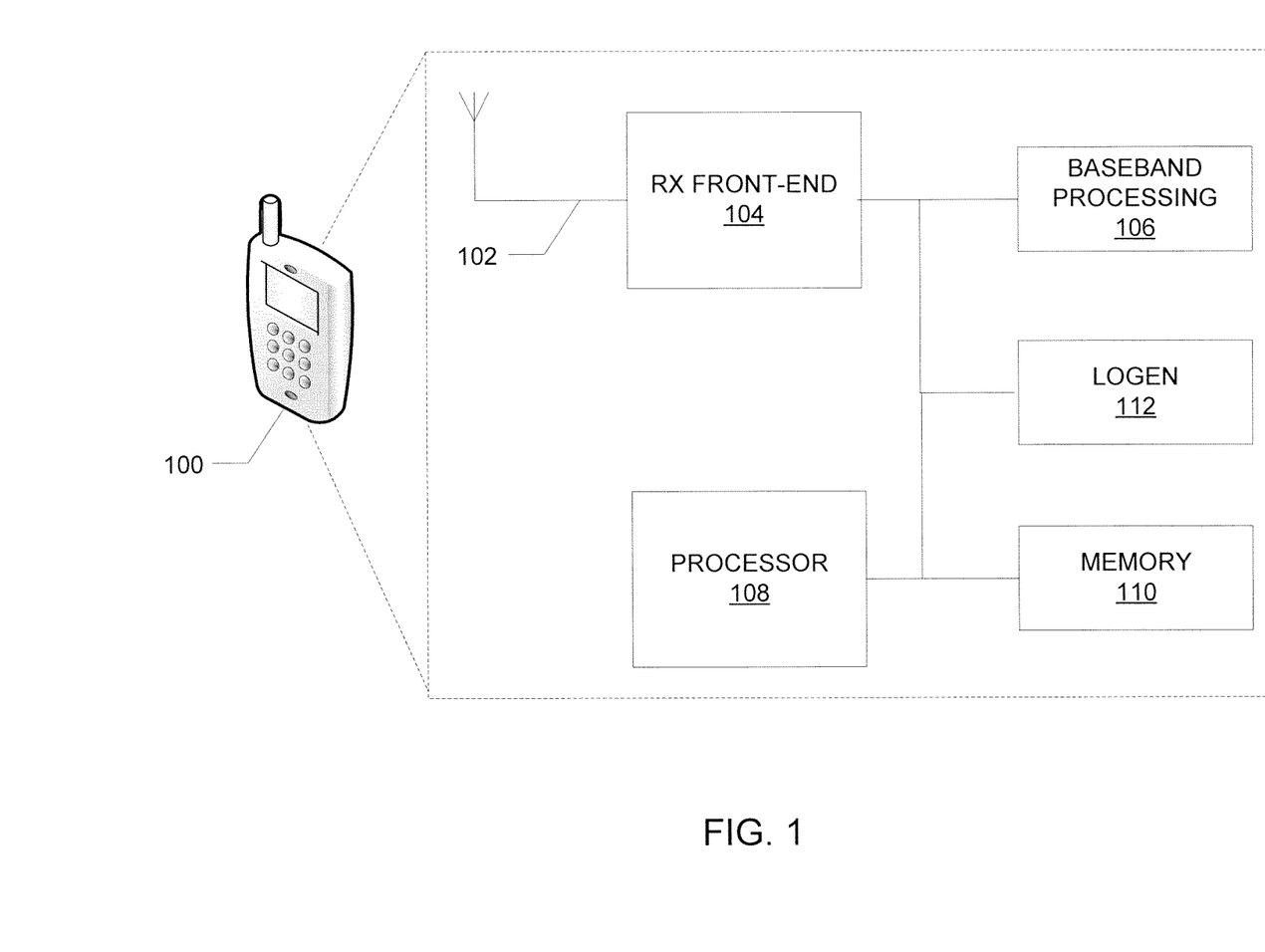
FIG. 1 illustrates a block diagram of a wireless communication device in accordance with one or more implementations.

FIG. 1 illustrates a block diagram of a wireless communication device 100 in which the subject technology may be used in accordance with one or more implementations. Referring to FIG. 1, the wireless communication device 100 includes an antenna 102, a receiver front-end 104, a baseband processing module 106, a processor 108, a memory 110, and a local oscillator generation module (LOGEN) 112. The blocks represented in FIG. 1 may be integrated on semiconductor substrates. For example, the blocks 104-112 may be realized in a single system-on-chip, or realized in a multi-chip chipset.

The antenna 102 is configured to transmit and/or receive wireless signals over a range of frequencies. Although a single antenna is illustrated, the subject disclosure is not so limited. The receiver front-end 104 includes logic, circuitry and/or interfaces that is operable to receive and process signals from the antenna 102. The receiver front-end 104, for example, may be operable to amplify and/or down-covert received wireless signals. The receiver front-end 104 also may be operable to cancel noise arising from impedance matching and is linear over a wide range of frequencies. In this regard, the receiver front-end 104 receives signals in accordance with a variety of wireless standards. The receiver front-end 104 may be applicable to standards, including but not limited to, Wi-Fi, WiMAX, Bluetooth, and various cellular standards.

The baseband processing module 106 includes logic, circuitry and/or interfaces that is operable to perform processing of baseband signals. The baseband processing module 106 may, for example, analyze received signals and generate control and/or feedback signals for configuring various components of the wireless communication device 100 such as the receiver front-end 104. The baseband processing module 106 is operable to encode, decode, transcode, modulate, demodulate, encrypt, decrypt, scramble, descramble, and/or otherwise process data in accordance with wireless standards.

The processor 108 includes logic, circuitry and/or interfaces that is operable to process data and/or control operations of the wireless communication device 100. In this regard, the processor 108 is configured to provide control signals to various other portions of the wireless communication device 100. The processor 108 may control transfers of data between various portions of the wireless communication device 100. Additionally, the processor 108 may provide for implementation of an operating system or otherwise execute code to manage operations of the wireless communication device 100.

The memory 110 includes logic, circuitry and/or interfaces for storage of various types of information such as received data, generated data, code, and/or configuration information. The memory 110 may include a non-transitory storage medium, including but not limited to, RAM, ROM, flash, and/or magnetic storage. According to some implementations of the subject disclosure, information stored in the memory 110 is utilized for configuring the receiver front-end 104 and/or the baseband processing module 106.

The LOGEN 112 includes logic, circuitry and/or interfaces that is operable to generate oscillating signals at multiple frequencies. The LOGEN 112 may be operable to generate digital and/or analog signals. In this regard, the LOGEN 112 is operable to generate clock signals and/or sinusoidal signals. Characteristics of the oscillating signals such as the frequency and duty cycle may be determined based on control signals from the processor 108 and/or the baseband processing module 106.

In operation, the processor 108 configures the various components of the wireless communication device 100 based on a wireless standard according to which it is desired to receive signals. Wireless signals are received via the antenna 102, amplified and down-converted by the receiver front-end 104. The baseband processing module 106 may perform noise estimation and/or noise cancellation, decoding, and/or demodulation of the baseband signals. In this regard, information in the received signal is recovered and utilized appropriately. For example, the information may be audio and/or video to be presented to a user of the wireless communication device 100, data to be stored to the memory 110, and/or information affecting and/or enabling operation of the wireless communication device 100.

Figure 2:
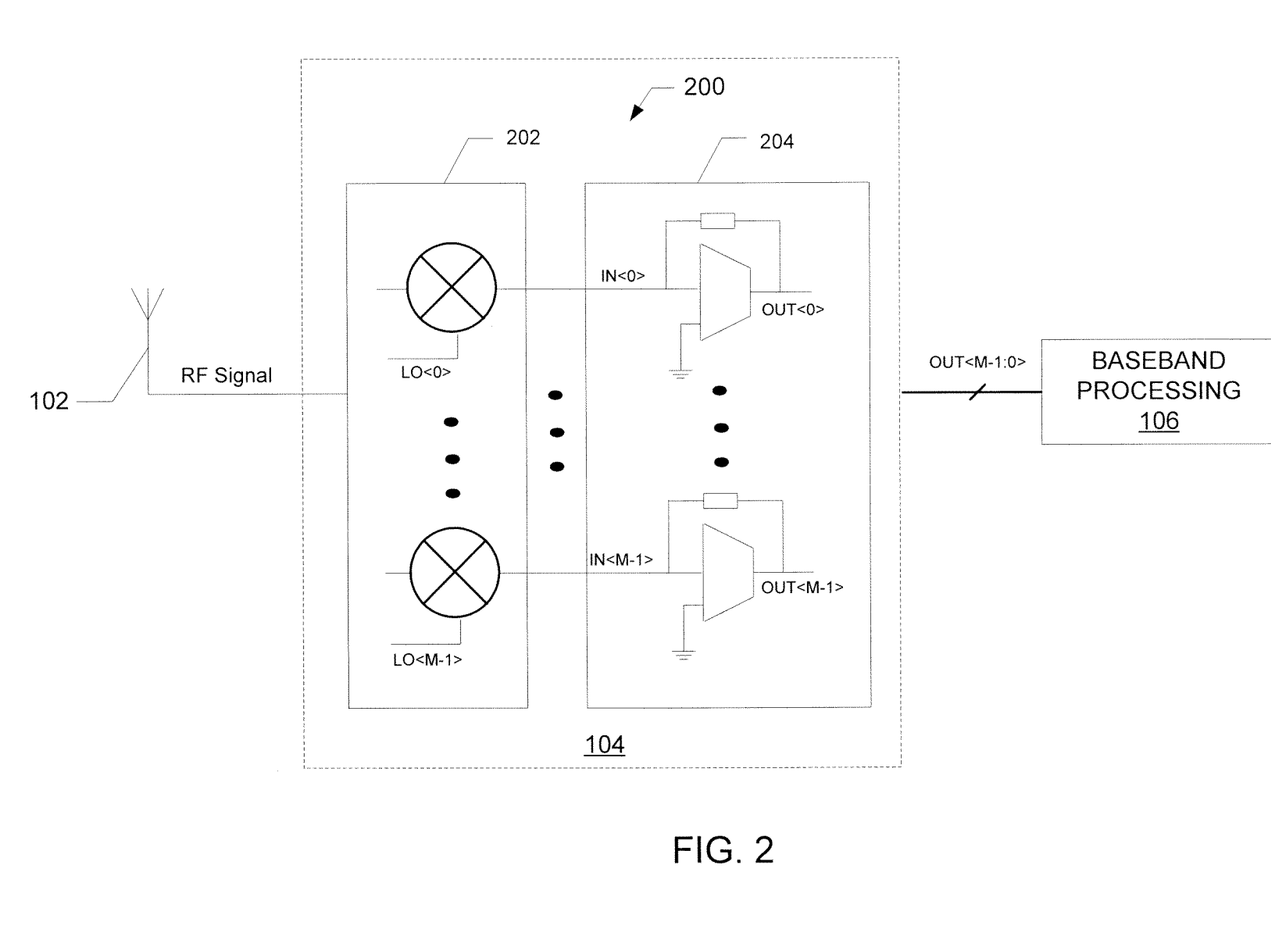
FIG. 2 illustrates a block diagram of an oversampling down-conversion path provided in the receiver front-end illustrated in FIG. 1 in accordance with one or more implementations.

FIG. 2 illustrates a block diagram of a oversampling down-conversion path 200 provided in the receiver front-end 104 illustrated in FIG. 1 in accordance with one or more implementations. The receiver front-end 104 represents a mixer-first front-end. The receiver front-end 104 connects to the antenna 102 and provides an output to the baseband processing module 106 for further processing (e.g., low-pass filtering, digitization, demodulation). The receiver front-end 104 can be used in several different devices such as cell phones, wireless modems, wireless routers and access points to receive wireless RF signals.

The oversampling down-conversion path 200 is composed of a passive mixer 202 and a transimpedance amplifier (TIA) 204. The passive mixer 202 is composed of M passive mixer switches, and the TIA 204 is composed of M transimpedance amplifiers, where M is a number of local oscillator (LO) phases employed. The oversampling down-conversion path 200 downconverts an RF signal to baseband using the passive mixer 202, and amplifies the baseband signal using the TIA 204 for baseband processing. The passive mixer 202 includes circuitry that may provide for generation of inter-modulation products resulting from mixing the RF signal with LO signals generated by the LOGEN 112 (FIG. 1). The passive mixer 202 is composed of metal-oxide semiconductor field effect transistors (MOSFET). Specifically, the passive mixer 202 is composed of n-channel MOSFETs (e.g., NMOS). However, the passive mixer 202 can be implemented using other types of switching devices. According to some implementations, the passive mixer 202 is configured to operate in its linear region when powered on.

The TIA 204 includes circuitry that is operable to output a voltage that is proportional to a current input to the TIA 204. In operation, the passive mixer 202 down-converts a current signal $I_{RF_{IN}}$ by an amount equal to the frequency of a LO signal (e.g., $LO_0$-$LO_{M-1}$). The current signal $I_{RF_{IN}}$ includes both the RF signal received by the antenna 102 and a thermal noise signal generated by an input matching resistance. The frequency of the LO signal can be tuned, for example, over a frequency range based on a position of a desired channel in the spectrum of the received RF signal.

The TIA 204 can be used to convert and scale the down-converted current signal at the output of the passive mixer 202 into a voltage signal $V_{OUT}$ such that the thermal noise generated by input matching resistance is canceled, while the RF signal received by the antenna 102 is reinforced.

The transfer function of the transimpedance amplifier 204 is determined based on its feedback network. According to some implementations, the transimpedance amplifier 204 includes a resistive element and a capacitive element in parallel in its feedback network. Capacitive elements can be included for stability purposes including resistive elements to set a current-to-voltage conversion gain for the transimpedance amplifier 204.

Following down-conversion of the RF signal received by the antenna 102, the baseband processing module 106 processes $V_{OUT}$ using one or more processors and/or circuits. For example, the baseband processing module 106 can low-pass filter $V_{OUT}$, either separately or after having been added (or subtracted) together by a weighting and recombination module (not shown), to remove blockers and other interference. In addition, the baseband processing module 106 can further perform digitization of $V_{OUT}$, either separately or after having been added (or subtracted) together, using one or more analog-to-digital converters (ADCs). The ADCs can be, for example, delta-sigma ADCs. In addition, the baseband processing module 106 can perform low-pass filtering and digitization of $V_{OUT}$ in an order relative to each other. Further, the baseband processing module 106 can demodulate the down-converted RF signal contained within $V_{OUT}$ to recover information.

According to some implementations, the receiver front-end 104 can be further constructed as a fully differential receiver front-end. In other words, the receiver front-end 104 can be further constructed to process a differential RF signal received by the antenna 102 by replacing the passive mixer 202 with a differential passive mixer.

Figure 3:
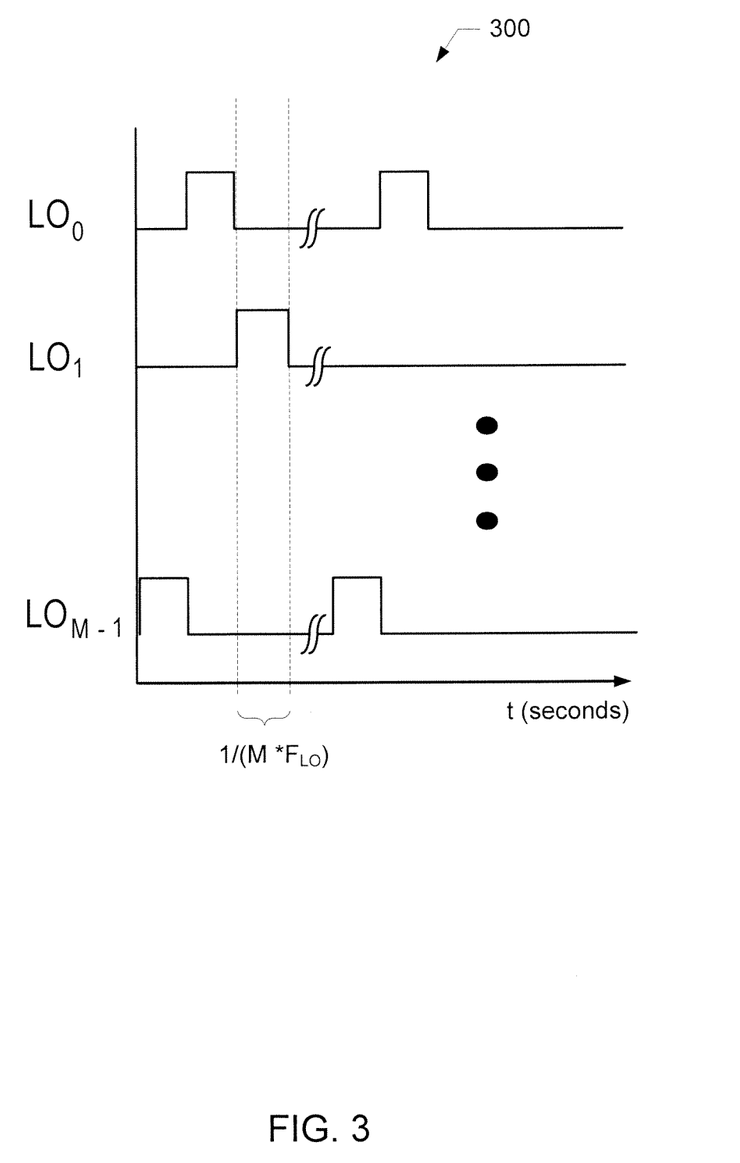
FIG. 3 illustrates a waveform diagram of local oscillator signals for use by the oversampling down-conversion path illustrated in FIG. 2 in accordance with one or more implementations.

FIG. 3 illustrates a waveform diagram of local oscillator signals for use by the oversampling down-conversion path 200 illustrated in FIG. 2 in accordance with one or more implementations. The LO signals 300 each correspond to a fundamental frequency (e.g., $\omega_{LO}$). Additionally, the LO signals 300 have successive phase shifts substantially equal to 360°/M and have duty cycles substantially equal to 1/M, where M is a number of LO signals employed. Alternatively, the variable M may be determined according to a number of harmonics corresponding to the fundamental frequency with a magnitude greater than a threshold magnitude. The threshold magnitude defines a magnitude that could potentially saturate the receiver front-end 104 if amplified.

According to some implementations, the LO signals 300 approximate a square waveform. Unlike a single-tone sinusoidal waveform, the square waveform contains harmonics at specific multiples of the fundamental frequency of the LO signal. Consequently, the output signal generated by the passive mixer 202 (FIG. 2) using the square waveform as a LO signal can contain harmonics corresponding to the LO frequency.

For example, when the number of harmonics presented around the fundamental frequency with a magnitude greater than the threshold magnitude is equal to eight, the LOGEN 112 (FIG. 1) can be configured to generate eight different LO signals (e.g., $LO_0$, $LO_1$, $LO_2$, up to $LO_7$) to address the eight harmonics. These eight LO signals each have successive phase shifts substantially equal to 360/8 degrees or 45 degrees. In addition, the duty cycle of each LO signal is substantially equal to ⅛ or 12.5%.

Figure 4:
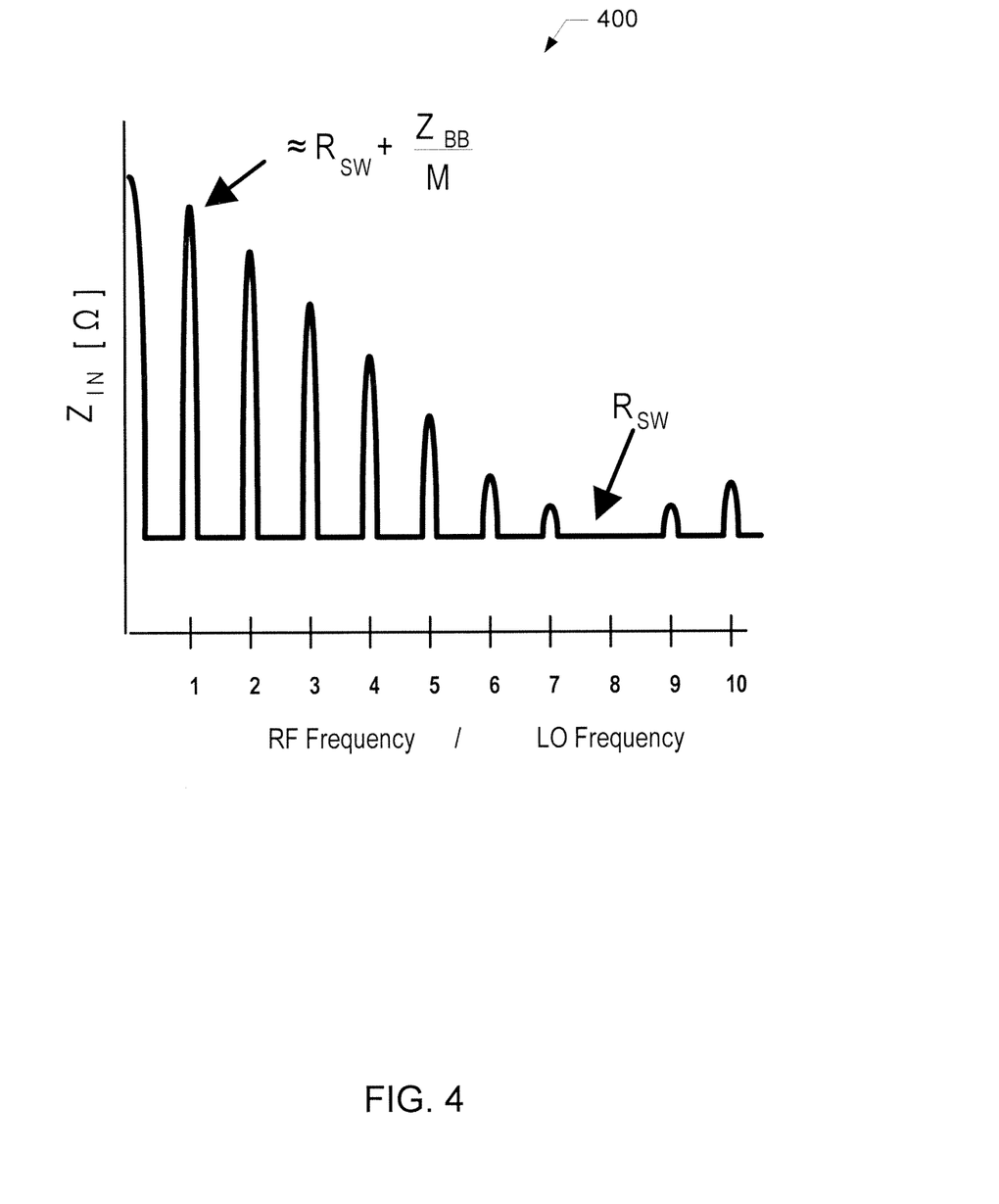
FIG. 4 illustrates an input impedance seen by the oversampling down-conversion path illustrated in FIG. 2 in accordance with one or more implementations.

FIG. 4 illustrates a waveform diagram 400 of an input impedance (e.g., $Z_{IN}$) seen by the oversampling down-conversion path 200 illustrated in FIG. 2 in accordance with one or more implementations. The waveform diagram 400 depicts the input impedance (or resistance (Ω)) as a function of the radio frequency (RF) or local oscillator (LO) frequency that is less than the radio frequency. The input impedance seen from an input to the passive mixer 202 (FIG. 2), is equivalent to a switch resistance (e.g., $R_{SW}$) except around harmonics of the RF frequency (e.g., during up-conversion) or LO frequency (e.g., during down-conversion) where the input impedance is equivalent to:

$$Z_{IN} \cong R_{SW} + \frac{Z_{BB}}{M} \qquad (1)$$

where M is a positive integer and represents the number of LO phases employed, $R_{SW}$ is the switch resistance of the passive mixer 202, and $Z_{BB}$ is the baseband impedance of the transimpedance amplifier 204. The baseband impedance varies with the frequency employed. The harmonics having an input impedance greater than the switch resistance provide a passband at integer multiples of a fundamental frequency. As such, harmonics can be seen from the first frequency multiple (e.g., $1\omega_{LO}$) up to the seventh frequency multiple (e.g., $7\omega_{LO}$).

The switch resistance represents the impedance of switching devices that may be provided in the passive mixer 202. At these frequencies, the input impedance is equal to the baseband impedance frequency shifted to these frequencies (e.g., down-conversion, up-conversion). Thus, the input impedance, if inserted at a node inside the receiver front-end 104 (FIG. 1), all incoming frequencies at that node except those residing at the fundamental frequency (e.g., $\omega_{LO}$) and its harmonics are subject to attenuation. While it may be desirable to have an amplification system centered only around the LO frequency, components from around $2\omega_{LO}$ up to around $7\omega_{LO}$, for example, will receive some amplification (e.g., with less gain compared with the desired input components at $\omega_{LO}$), but with minimal folding.

Figure 5:
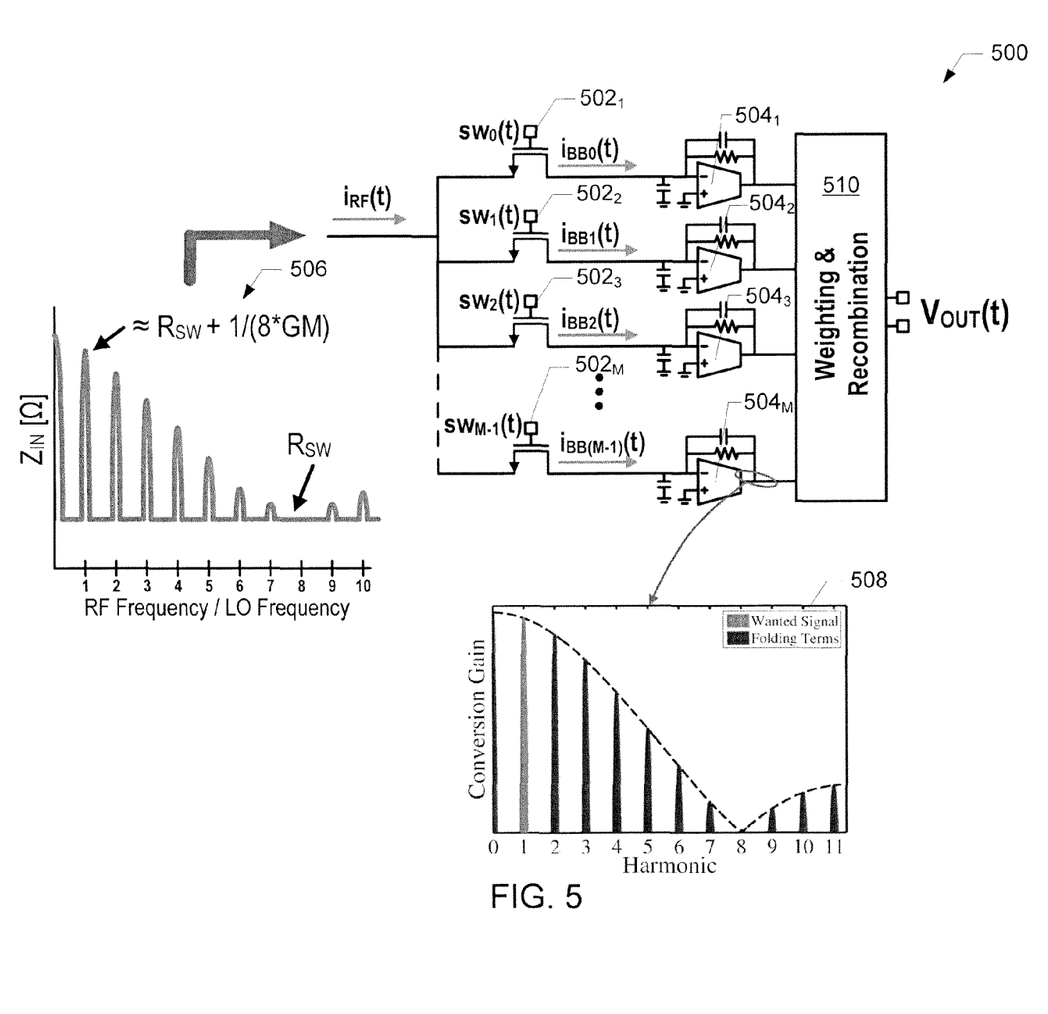
FIG. 5 illustrates a conceptual diagram of an oversampling down-conversion path in accordance with one or more implementations.

FIG. 5 illustrates a conceptual diagram of an oversampling down-conversion path 500 in accordance with one or more implementations. According to some implementations, the oversampling down-conversion path 500 is composed of the passive mixer 202 (FIG. 2) and the transimpedance amplifier 204 (FIG. 2) coupled to a weighting and recombination module 510. The passive mixer 202 is composed of switches $502_1$-$502_M$ and the transimpedance amplifier 204 is composed of TIAs $504_1$-$504_M$, where M is a positive integer and represents the number of LO phases employed. The switches $502_1$-$502_M$ receive non-overlapping LO signals that are shifted by 360/M degrees from one another as illustrated in FIG. 3.

In operation, each of the switches $502_1$-$502_M$ down-converts an RF current input ($i_{RF}(t)$) using an input impedance profile 506, which defines impedances at harmonics of the corresponding RF or LO frequency. In a case of a mixer-first topology, the RF current input represents the input to the receiver front-end 104 (FIG. 1). Each of the TIAs $504_1$-$304_M$ receives a baseband current ($I_{BBM}(t)$) for conversion into a corresponding voltage output.

According to some implementations, the impedance at a first harmonic may be approximated as:

$$Z_{IN} \cong R_{SW} + \frac{1}{M * G_M} \qquad (2)$$

where M is equal to the number of LO phases employed, $R_{SW}$ is the switch resistance of a respective one of the switches $502_1$-$502_M$, and $1/G_M$ is the input impedance of a respective one of the TIAs $504_1$-$504_M$. This corresponds to the series sum of the resistance of a single mixer switch and the up-converted impedance of the baseband TIAs. This is an idealized and simplified understanding, whereas an actual circuit implementation may result in a significantly altered impedance profile.

A waveform diagram 508 illustrates the conversion gain (e.g., y-axis) at each of the TIAs $504_1$-$504_M$ as a function of a harmonic multiple (e.g., x-axis). As illustrated, down-converted harmonics arising from integer multiples of the LO frequency (e.g., $2^{nd}$ through $7^{th}$ harmonics) may be present at the output of the TIAs. Accordingly, the down-conversion of unwanted signals produces folding terms that saturate the receiver front-end 104 due to the gain compression caused by the blocker signals experiencing a voltage gain. Therefore causing large blocker signals to interfere with the wanted signal. The TIAs $504_1$-$504_M$ are configured to provide large voltage amplification and, so, these unwanted harmonics (or folding terms) can saturate the receiver.

Figure 6:
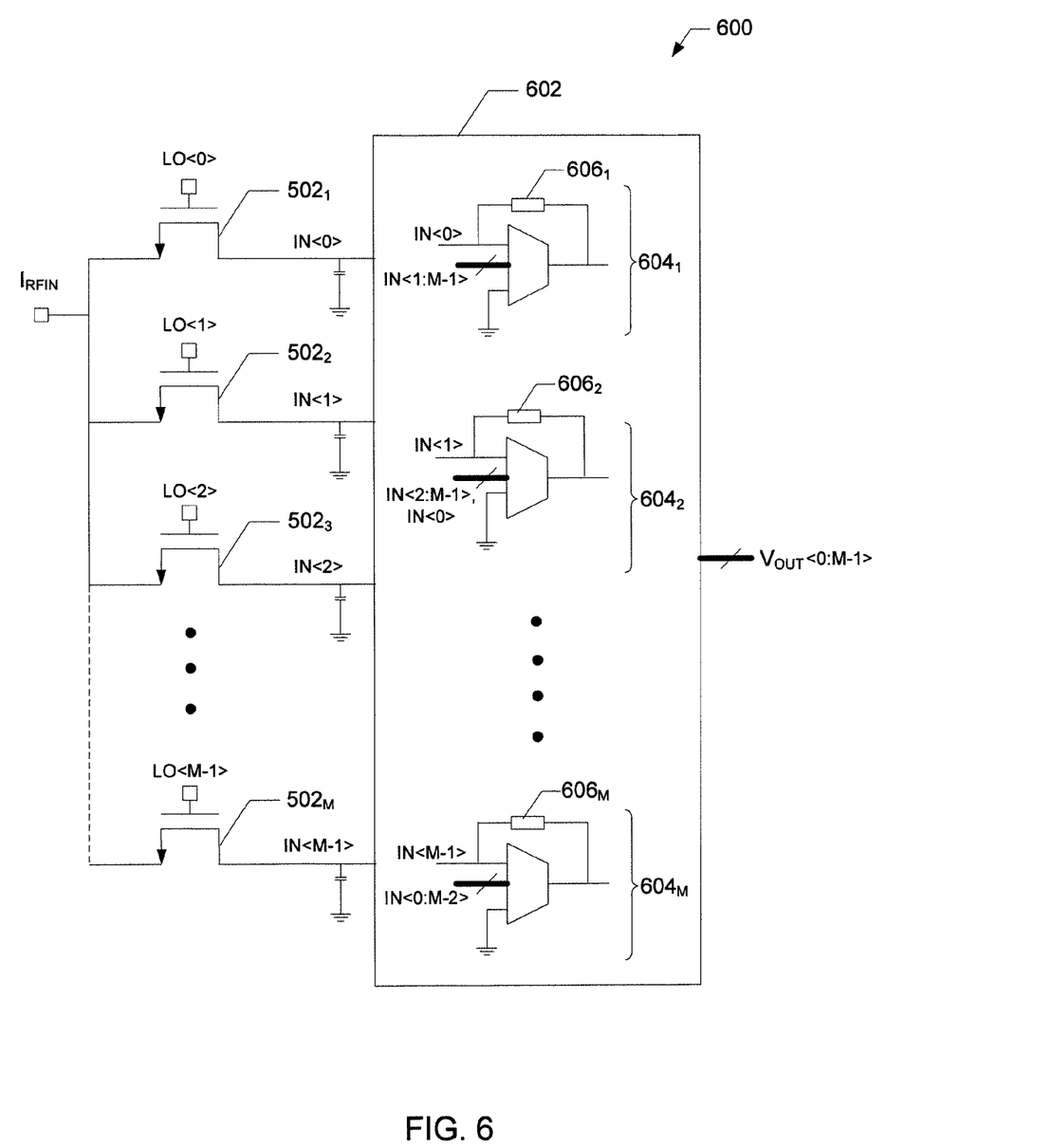
FIG. 6 illustrates a block diagram of an oversampling down-conversion path with baseband harmonic rejection in accordance with one or more implementations.

FIG. 6 illustrates a block diagram of an oversampling down-conversion path 600 with baseband harmonic rejection in accordance with one or more implementations. Referring to FIG. 6, the oversampling down-conversion path 600 includes switches $502_1$-$502_M$ and a bank of transimpedance amplifiers 602. The bank of transimpedance amplifiers 602 is composed of TIAs $604_1$-$604_M$. Each of the TIAs $604_1$-$604_M$ includes a feedback circuit (e.g., $606_1$-$606_M$). Each of the feedback circuits $606_1$-$606_M$ includes one or more components (e.g., a capacitor, a resistor) for setting a gain and/or frequency response of the corresponding one of the TIAs $604_1$-$604_M$. According to some implementations, M is equal to an even integer, including but not limited to, 8, 16, and 32.

In one or more implementations, the TIAs $604_1$-$604_M$ are configured to receive M down-conversion signals from respective ones of the switches $502_1$-$502_M$. Each of the TIAs $604_1$-$604_M$ includes multiple transconductance cells with a particular transconductance weighting to output a weighted current signal. A feedback impedance (e.g., feedback circuits $606_1$-$606_M$) is coupled between an input of a respective one of the transconductance cells and outputs of the TIAs $604_1$-$604_M$ to convert the weighted current signal into a voltage output with a voltage gain such that the wanted signal arising from a first harmonic realizes the voltage gain and unwanted signals corresponding to harmonics at integer multiples of the first harmonic are rejected without amplification.

Each of the TIAs $604_1$-$604_M$ is configured to provide baseband amplification with harmonic rejection. The TIAs $604_1$-$604_M$ are operable to convert an input current signal into an output voltage signal proportional to the input current signal. For example, each of the TIAs $604_1$-$604_M$ amplifies a down-converted signal from an output of one of the switches $502_1$-$502_M$ into a corresponding voltage signal.

In one or more implementations, the switches $502_1$-$502_M$ collectively form the passive mixer 202 (FIG. 2) and each include, for example, a single NMOS transistor. Multiple LO signals (e.g., LO<M−1:0>), each phase-shifted with respect to one another, are generated by the LOGEN 112 (FIG. 1). Each of the switches $502_1$-$502_M$ receives one of the LO signals. For example, for M=8, 8 LO signals corresponding to 8 phases are generated and each are configured to have a 12.5% duty-cycle such that only one of the 8 LO signals is in a logic-high state at a given time instant. As such, the outputs from the switches $502_1$-$502_M$ are identical in magnitude but shifted in phase by 360/M degrees.

Each of the TIAs $604_1$-$604_M$ receives a different ordering of the LO signals. For example, the first TIA $604_1$ receives a mixed signal (e.g., IN<0>) via a first input port and the remaining mixed signals IN<1:M−1>) via respective input ports. The second TIA $604_2$ receives a mixed signal (e.g., IN<2>) via a first input port and the remaining mixed signals (e.g., ordered as IN<2:M−1>, IN<0>) via respective input ports. Additionally, the last TIA $604_M$ receives a mixed signal (e.g., IN<M−1>) via a first port and the remaining mixed signals (e.g., IN<0:M−2>) via respective ports.

In operation, an input current signal, $I_{RF_{IN}}$, is received and processed via a signal path including the switches $502_1$-$502_M$ and the TIAs $604_1$-$604_M$. Each of the switches $502_1$-$502_M$ is configured to mix the input current signal with a respective LO signal to downconvert the received input current signal to baseband (e.g., reduce frequency to a baseband or intermediate frequency). The baseband output of each of the switches $502_1$-$502_M$ is input to a corresponding one of the TIAs $604_1$-$604_M$. Each of the TIAs $604_1$-$604_M$ converts the current output of a corresponding one of the switches $502_1$-$502_M$ to a corresponding voltage. There is a gain associated with the current-to-voltage conversion.

The combined output voltage, $V_{OUT}$<M−1:0> may be preconfigured and/or dynamically configured during operation of the oversampling down-conversion path 600 to maintain, within a tolerance, the following relationship:

$$V_{OUT}=R_F I_{IN}, \text{ where } m=1+/-GM, \text{ otherwise 0.} \quad (3)$$

where G is an integer and represents a factor of proportionality, and M represents the number of LO phases employed. That is, the effective transconductance for harmonics around a wanted signal causes a current change through the transconductance cell to realize a voltage output; whereas, the effective transconductance for harmonics at integer multiples of the wanted signal is equal to zero.

The feedback impedance is approximately given by:

$$Z_{IN}=1/G_m, \text{ where } m=1+/-kM, \text{ otherwise } \infty. \quad (4)$$

where m determines an effective transconductance, k is an integer and represents a factor of proportionality, M represents the number of LO phases employed.

Figure 7:
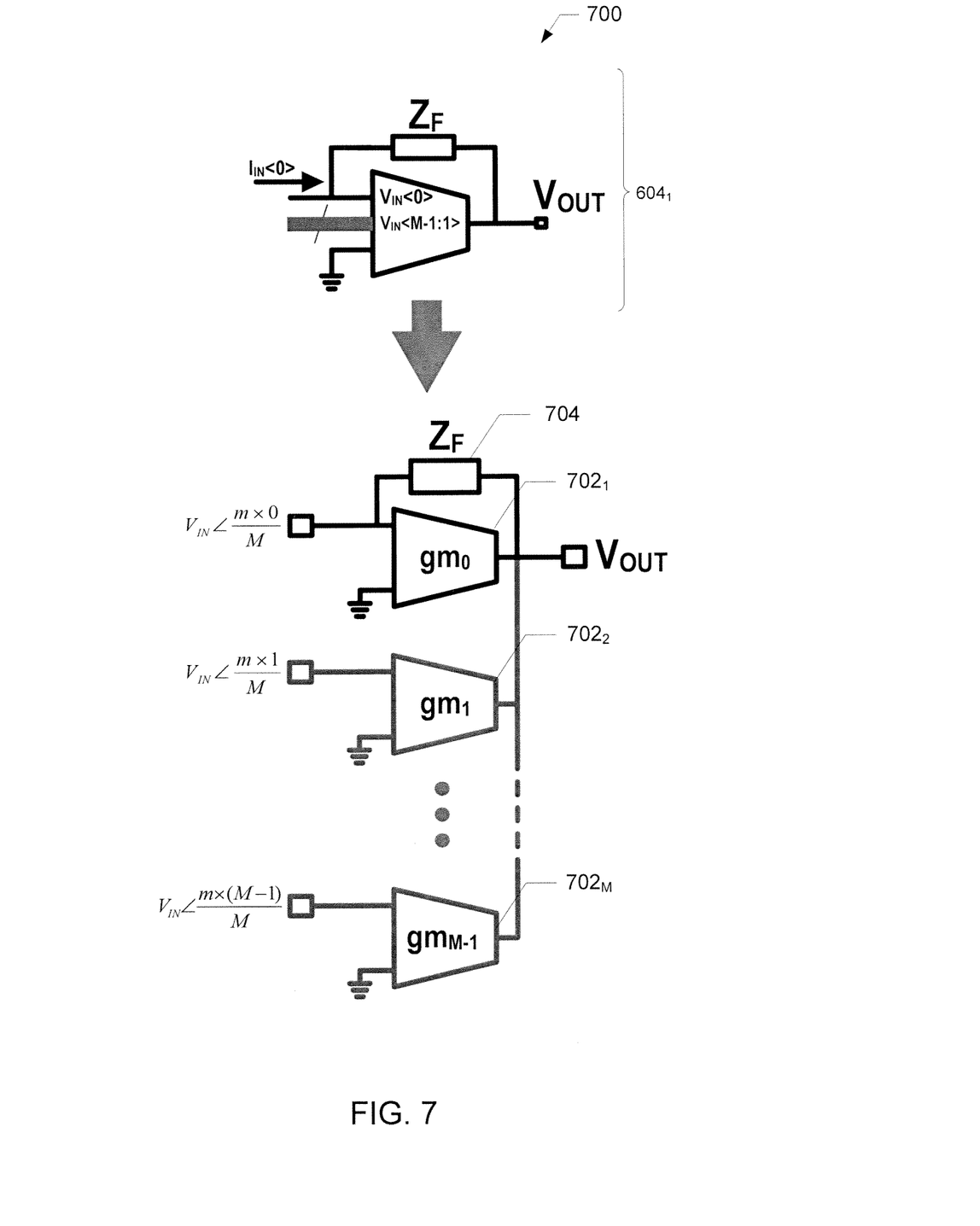
FIG. 7 illustrates a block diagram of a single transimpedance amplifier used in the oversampling down-conversion path illustrated in FIG. 6 in accordance with one or more implementations.

FIG. 7 illustrates a block diagram of a single transimpedance amplifier used in the oversampling down-conversion path 600 illustrated in FIG. 6 in accordance with one or more implementations. The receiver front-end 104, as discussed with respect to FIG. 1, is enhanced with baseband harmonic rejection. For example, the TIAs $604_1$-$604_M$ (FIG. 6) can each be expanded to include multiple transconductance cells $702_1$-$702_M$ (e.g., labeled $gm_0$-$gm_{M-1}$) to receive the down-converted signals from respective ones of the switches $502_1$-$502_M$ (FIG. 6), where M is a positive integer and represents the number of LO phases employed. The transconductance cells $702_1$-$702_M$ receive a feedback impedance 704 that is coupled between an input of one of the transconductance cells $702_1$-$702_M$ (e.g., $702_1$) and outputs of the transconductance cells to convert a down-converted signal into a voltage output with a voltage gain.

Each down-converted signal has a wanted signal arising from a first harmonic and unwanted signals arising from harmonics of the wanted signal. In one or more implementations, the input voltage, $L_{IN}$, to each transconductance cell is preconfigured and/or dynamically configured during operation of the single transimpedance amplifier 700 to maintain, the following relationship:

$$V_{IN} L \frac{m*(M-1)}{M} \quad (5)$$

where m describes a harmonic from where the signal originated from, and M represents the number of LO phases employed. For instance, if the signal is the wanted signal, where the variable m originates from around the first harmonic, then m=1. If the signal is an unwanted blocker located around the $5^{th}$ harmonic, then m=5.

Here, the input voltage defines a geometric relationship between the voltages corresponding to respective harmonics applied to the transconductance cells $702_1$-$702_M$. As such, the input voltages cause each of the transconductance cells $702_1$-$702_M$ to be weighted accordingly such that their effective transconductance realizes a current change through the transconductance cell for outputs corresponding to a wanted signal.

By appropriately weighting the M transconductance cells in each of the TIAs $604_1$-$604_M$, the harmonic rejection circuit can be configured to amplify the wanted down-converted signal arising from the first harmonic (e.g., m=1), but reject without amplification all unwanted signals that arise from harmonics of the wanted signal (up to the M-$1^{th}$ harmonic). This is so because the weighting causes the effective transconductance of the transconductance cell $702_1$ to be large when excited by signals arising from m=1, but zero otherwise. In other words, the weighting causes certain current signals to shift in phase such that signals with opposing phases cancel one another at the output (e.g., $V_{OUT}$), thus resulting in no voltage gain for the canceled current signals. Given that there is no amplification of harmonic blockers at outputs of the TIAs $604_1$-$604_M$ with the enhanced harmonic rejection circuit, no harmonic blockers up to the $(M-1)^{th}$ harmonic can saturate the receiver. According to some implementations, the transconductance cells $702_1$-$702_M$ are configured to only amplify a signal from a harmonic (not just m=1, e.g., m=3), and further configured to only amplify signals arising from more than one harmonic multiple of LO (e.g., signals from m=1 and m=3).

In one or more implementations, each of the multiple transconductance cells $702_1$-$702_M$ has a transconductance weighting equivalent to:

$$gm_X = k\left[1 + \cos\left(\frac{2\pi X}{M}\right)\right], \quad (6)$$
$$X = [0, 1, \ldots M-1]$$

or possibly, $$gm_X = k\left[\cos\left(\frac{2\pi X}{M}\right)\right], \quad (7)$$
$$X = [0, 1, \ldots M-1]$$

when a fully differential receiver (that uses fully-differential passive mixers) is employed, where X is an integer that represents one of the transconductance cells $702_1$-$702_M$, M is the number of LO phases employed, and k is an arbitrary constant that determines the effective transconductance of the transconductance cell. As such, the transconductance gain is shifted to reject integer multiples of the wanted signal. The transconductance based on equation (6) can provide more immunity to blockers arising from even-numbered harmonics than the transconductance based on equation (7), but may utilize more current for the same noise performance.

Alternatively, when differential mixers are employed (in other words fully differential RF inputs are available), each of the transconductance cells $702_1$-$702_M$ has a transconductance weighting equivalent to equation (7), as shown above, where M is a positive integer and represents the number of LO phases employed. As such, the transconductance gain is shifted to reject odd integer multiples of the wanted signal only.

The transconductance cells $702_1$-$702_M$ can be implemented using other transconductance devices. The harmonic rejection circuit can be implemented in a voltage amplifier, current amplifier, operational amplifier, signal amplifier or any variation of transconductance. The harmonic rejection circuit also can be applied to single-stage amplifiers or amplifiers employing multiple amplification stages. According to some implementations, the single transimpedance amplifier 700 and the above-described elements are varied and are not limited to the functions, structures, configurations, implementations or examples provided.

Figure 8:
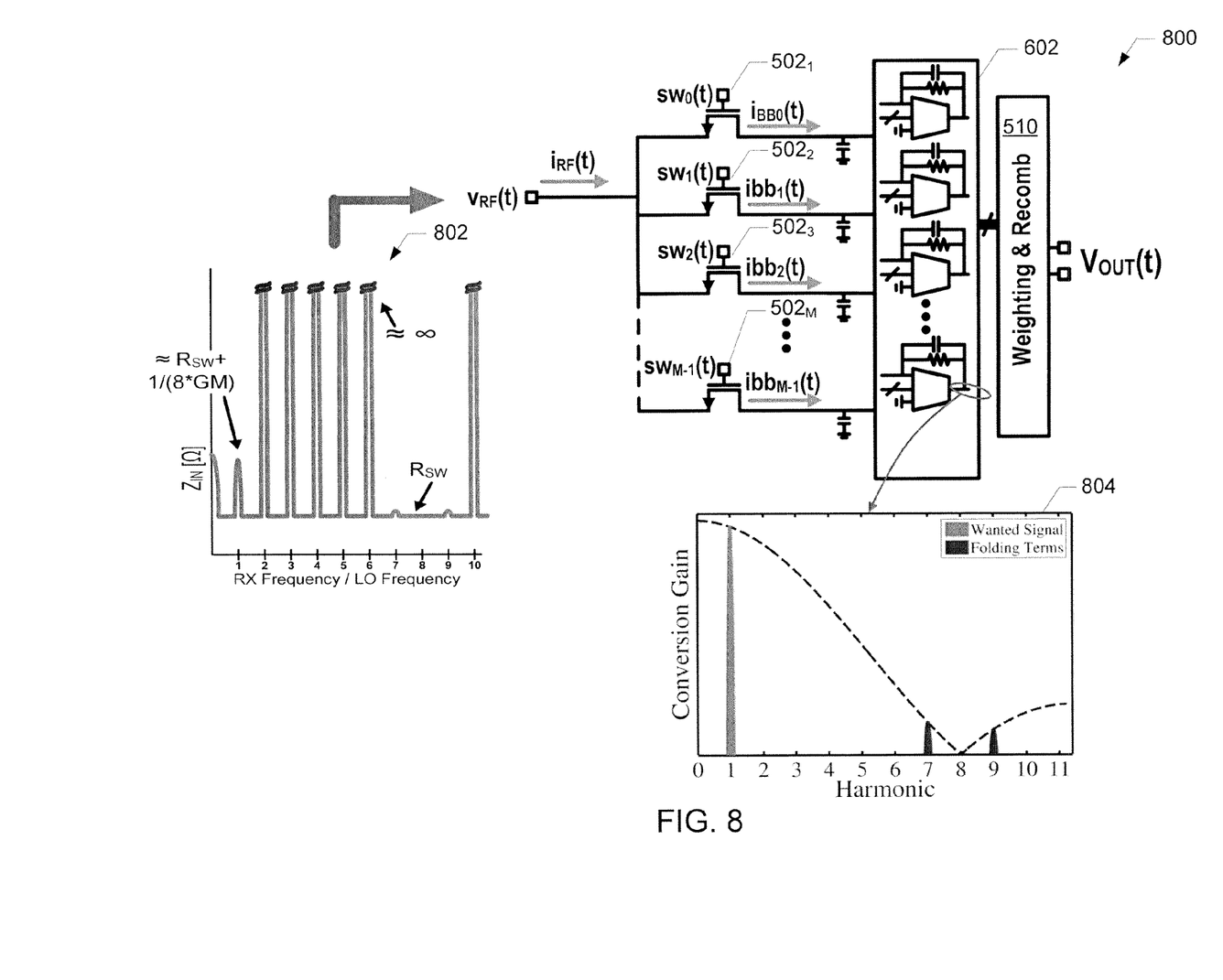
FIG. 8 illustrates a conceptual diagram of the oversampling down-conversion path with baseband harmonic rejection illustrated in FIG. 6 in accordance with one or more implementations.

FIG. 8 illustrates a conceptual diagram of the oversampling down-conversion path 600 with baseband harmonic rejection illustrated in FIG. 6 in accordance with one or more implementations. In operation, each of the switches $502_1$-$502_M$ receives an RF current signal (e.g., $I_{RF}(t)$) using an input impedance profile 802 that defines impedances at harmonics of the corresponding radio frequency or LO frequency. For example, the resistance at a first harmonic may be approximated according to equation (2), shown above, where M represents the number of LO phases employed, $R_{SW}$ is the switch resistance of a respective one of the switches $502_1$-$502_M$, and $1/G_M$ is the input impedance of a respective TIA in the transimpedance amplifier 602. This corresponds to the series sum of the resistance of a single switch and the up-converted impedance of the baseband TIAs. This is an idealized and simplified understanding, whereas an actual circuit implementation may result in a significantly altered impedance profile. Each of the TIAs provided in the transimpedance amplifier 602 receives a baseband current ($I_{BBM}(t)$) for conversion into a corresponding voltage output.

Based on the input impedance profile 802, only the first harmonic excites a voltage gain since the transconductance weighting ensures that unwanted harmonics do not excite a current from the transconductance cell (or equivalently the effective transconductance of the transconductance cell to drop to zero). Additionally, the input impedance profile 802 defines impedances between the $2^{nd}$ and $6^{th}$ harmonics as substantially large (e.g., infinity). Because the unwanted signals (or folding terms) do not realize voltage amplification, the gain compression is reduced around these LO harmonic frequencies.

A waveform diagram 804 illustrates the conversion gain at each of the TIAs provided in the transimpedance amplifier 602 as a function of a harmonic multiple. As illustrated, a wanted signal and minimal feed-through signals are realized at certain frequencies in the receive band. Accordingly, the folding terms are reduced such that only unwanted folding terms around the $7^{th}$ and $9^{th}$ harmonics of the wanted signal are realized, which are of negligible magnitude. The wanted signal around the $1^{st}$ harmonic realizes a voltage gain based on the input impedance profile 802.

According to some implementations, the subject technology relates to an apparatus within the receiver front-end 104 (FIG. 1) that is configured for baseband amplification with harmonic rejection, particularly for large harmonic blockers. The apparatus includes means for receiving a mixer signal down-converted from a radio frequency signal. The apparatus also includes means for converting the mixer signal into a weighted current signal proportional to a voltage corresponding to the mixer signal based on an effective transconductance. The apparatus also includes means for outputting the mixer signal with amplification using a feedback impedance such that a wanted signal receives the amplification and unwanted signals are rejected without amplification. The effective transconductance has a first magnitude for frequency components of the down-converted signal arising from a first harmonic and the effective transconductance has a second magnitude less than the first magnitude for frequency components of the down-converted signal arising from harmonics at integer multiples of the first harmonic.

One or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "receiver", "amplifier", "transconductance cell," and "mixer" all refer to electronic or other technological devices. These terms exclude people or groups of people.

The predicate words "configured to" and "operable to" do not imply any particular tangible or intangible modification of a subject, but, rather, are intended to be used interchangeably. In one or more implementations, a receiver configured to receive and process an operation or a component may also mean the receiver being operable to receive and process the operation.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "implementation" does not imply that such implementation is essential to the subject technology or that such implementation applies to all configurations of the subject technology. A disclosure relating to an implementation may apply to all implementations, or one or more implementations. An implementation may provide one or more examples of the disclosure. A phrase such an "implementation" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A transimpedance amplifier, comprising:
a plurality of transconductance cells coupled to one another at outputs of the plurality of transconductance cells and configured to receive down-converted signals that vary from one another to produce a weighted current signal proportional to a voltage corresponding to a respective down-converted signal; and
a feedback impedance coupled to an input of one of the plurality of transconductance cells, wherein the outputs of at least two of the plurality of transconductance cells is coupled to the feedback impedance,
wherein each of the plurality of transconductance cells has an effective transconductance of a first magnitude for frequency components of the down-converted signal arising from a first harmonic and an effective transconductance of a second magnitude less than the first magnitude for frequency components of the down-converted signal arising from harmonics at integer multiples of the first harmonic.

2. The transimpedance amplifier of claim 1, wherein each of the plurality of transconductance cells comprises differential inputs.

3. The transimpedance amplifier of claim 2, wherein each of the plurality of transconductance cells has a transconductance weighting of $$k\left[\cos\left(\frac{2\pi X}{M}\right)\right],$$

where X is an integer that represents one of the plurality of transconductance cells, where k is an arbitrary constant that determines the effective transconductance of the transconductance cell, where M is a number of local oscillator (LO) phases employed, wherein the transconductance weighting is shifted to reject odd integer multiples of the wanted signal.

4. The transimpedance amplifier of claim 1, wherein each of the plurality of transconductance cells comprises a set of inputs, each of the set of inputs is configured to receive respective ones of local oscillator (LO) phases employed.

5. The transimpedance amplifier of claim 1, wherein each of the transconductance cells further comprises an input coupled to ground, wherein the down-converted signal is shifted in frequency according to a respective local oscillator signal.

6. The transimpedance amplifier of claim 1, wherein the weighted current signals are each shifted in phase of one another by 360/M degrees, where M is a number of local oscillator phases employed.

7. The transimpedance amplifier of claim 1, wherein the voltage corresponding to the down-converted signal is equivalent to $$V_{INL} \frac{m*(M-1)}{M},$$

where m is a local oscillator (LO) harmonic from around which an input signal arises, and M represents a number of LO phases employed.

8. The transimpedance amplifier of claim 1, wherein each of the plurality of transconductance cells comprises single-ended inputs.

9. The transimpedance amplifier of claim 8, wherein each of the plurality of transconductance cells has a transconductance weighting of $$k\left[1 + \cos\left(\frac{2\pi X}{M}\right)\right],$$

where X is an integer that represents one of the plurality of transconductance cells, where k is an arbitrary constant that determines the effective transconductance of the transconductance cell, where M is a number of local oscillator (LO) phases employed, wherein the transconductance weighting is shifted to reject integer multiples of a wanted signal arising from the first harmonic.

10. The transimpedance amplifier of claim 1, wherein the down-converted signals vary by being shifted in phase from one another.

11. The transimpedance amplifier of claim 1, wherein the voltage corresponding to the down-converted signal is based at least on a local oscillator (LO) harmonic from around which an input signal arises and a number of LO phases employed.

12. An apparatus in a receiver for baseband harmonic rejection, the apparatus comprising:
a plurality of frequency conversion cells configured to mix an input signal with a plurality of non-overlapping local oscillator (LO) signals to produce down-converted signals; and
a plurality of transimpedance amplifiers coupled to the plurality of frequency conversion cells and configured to produce output voltage signals proportional to respective ones of the down-converted signals, wherein each of the plurality of transimpedance amplifiers comprises:
a plurality of transconductance cells coupled to one another at outputs of the plurality of transconductance cells and each configured to receive respective ones of the down-converted signals to produce a weighted current signal proportional to a voltage corresponding to the down-converted signal,
wherein each of plurality of transconductance cells has an effective transconductance of a first magnitude for frequency components of the input signal arising from a first harmonic and an effective transconductance of a second magnitude less than the first magnitude for frequency components of the input signal arising from harmonics at integer multiples of the first harmonic.

13. The apparatus of claim 12, wherein the weighted current signals corresponding to the integer multiples of the first harmonic are configured with phases of opposing polarities such that their constructive sum is zero.

14. The apparatus of claim 12, wherein the output voltage signals are each proportional to a weighted current signal having frequency components corresponding to a wanted signal.

15. The apparatus of claim 12, wherein each of the plurality of transconductance cells is configured with a transconductance weighting that causes the effective transconductance of the transconductance cell to be non-zero when excited by a down-converted signal arising from a harmonic within a frequency band of interest but zero for a down-converted signal arising from harmonics outside the frequency band of interest.

16. The apparatus of claim 12, wherein the input signal comprises an input impedance profile that provides infinite resistance for frequency components arising from at least a portion of the harmonics at the integer multiples of the first harmonic.

17. The apparatus of claim 12, wherein, for at least one of the plurality of transimpedance amplifiers, the voltage corresponding to the down-converted signal is based at least on a local oscillator (LO) harmonic from around which an input signal arises and a number of LO phases employed.

18. A method for baseband amplification with harmonic rejection, the method comprising:
receiving, by a plurality of transconductance cells, a plurality of mixed signals wherein each of the plurality of mixed signals is down-converted from a radio frequency signal;
converting the plurality of mixed signals into a weighted current signal proportional to a voltage corresponding to a respective mixed signal based on an effective transconductance; and
coupling outputs of at least two of the plurality of transconductance cells to a feedback impedance to convert the weighted current signal to a voltage gain such that a wanted signal receives the voltage gain and unwanted signals are rejected without amplification,
wherein the effective transconductance has a first magnitude for frequency components of at least one of the plurality of mixed signals arising from a first harmonic and the effective transconductance has a second magnitude less than the first magnitude for frequency components of the at least one of the plurality of mixed signals arising from harmonics at integer multiples of the first harmonic.

19. The method of claim 18, further comprising:
receiving a plurality of local oscillator signals to produce the plurality of mixed signals by mixing the radio frequency signal with the plurality of local oscillator signals.

20. The method of claim 18, wherein the voltage corresponding to the mixed signal is based at least on a local oscillator (LO) harmonic from around which an input signal arises and a number of LO phases employed.

* * * * *